(12) United States Patent
Nakamichi

(10) Patent No.: US 6,476,695 B1
(45) Date of Patent: Nov. 5, 2002

(54) HIGH FREQUENCY MODULE

(75) Inventor: Masumi Nakamichi, Tenri (JP)

(73) Assignee: Sharp Kabushiki Kaisha, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,691

(22) Filed: May 26, 2000

(30) Foreign Application Priority Data

May 26, 1999 (JP) .......................................... 11-146137

(51) Int. Cl.$^7$ ................................................ H01P 3/08
(52) U.S. Cl. ....................................... 333/246; 333/172
(58) Field of Search ................................ 333/246, 172, 333/185; 174/255

(56) References Cited

U.S. PATENT DOCUMENTS

| | | | | |
|---|---|---|---|---|
| 4,203,081 A | * | 5/1980 | Braeckelmann | 333/138 |
| 4,489,364 A | * | 12/1984 | Chance et al. | 361/395 |
| 4,803,595 A | * | 2/1989 | Kraus et al. | 361/412 |
| 5,177,594 A | * | 1/1993 | Chance et al. | 257/678 |
| 5,351,020 A | * | 9/1994 | Okamura et al. | 333/175 |
| 5,910,755 A | * | 6/1999 | Mishiro et al. | 333/24 |
| 6,191,667 B1 | * | 2/2001 | Takenaka et al. | 333/185 |
| 6,246,300 B1 | * | 6/2001 | Aichholzer et al. | 333/172 |

FOREIGN PATENT DOCUMENTS

| | | |
|---|---|---|
| JP | 57202774 | 12/1982 |
| JP | 61020363 | 1/1986 |

OTHER PUBLICATIONS

"Denshizairyo" Sep., 1997, Atsushi Kanda, pp. 29–33. English language version attached.

* cited by examiner

Primary Examiner—Robert Pascal
Assistant Examiner—Joseph Chang (57) ABSTRACT

A high frequency module is provided with a resistor array layer with interconnections, in which a plurality of resistor elements having a prescribed resistance value are formed as an array, and in which an interconnection pattern for providing electrical connection to each resistor element is formed in advance. Additionally, a capacitor array layer with interconnection in which a plurality of capacitor elements having a prescribed capacitance value are formed as an array and an interconnection pattern for providing electrical connection to each capacitor element is also formed in advance for later use. A desired circuit constant is obtained by providing interconnections among the plurality of resistor elements and among the plurality of capacitor elements, respectively, in any given combination by simply modifying the respective interconnection patterns instead of the entire module. With this configuration, a high frequency module of a more compact and lighter type which facilitates design modification is provided at a low cost.

25 Claims, 7 Drawing Sheets

HIGH FREQUENCY MODULE

BACKGROUND OF THE INVENTION

1. Field of the Invention

The present invention relates to a high frequency module suitable for a cellular phone and the like.

2. Description of the Background Art

In a conventional high frequency module, a strip line including a microstrip line is formed using a one-sided substrate, a double-sided substrate, or even a stacked layer substrate according to its purpose, and a resistor, a capacitor, and also a semiconductor component required for the circuitry are mounted on the top layer.

Figure 8:
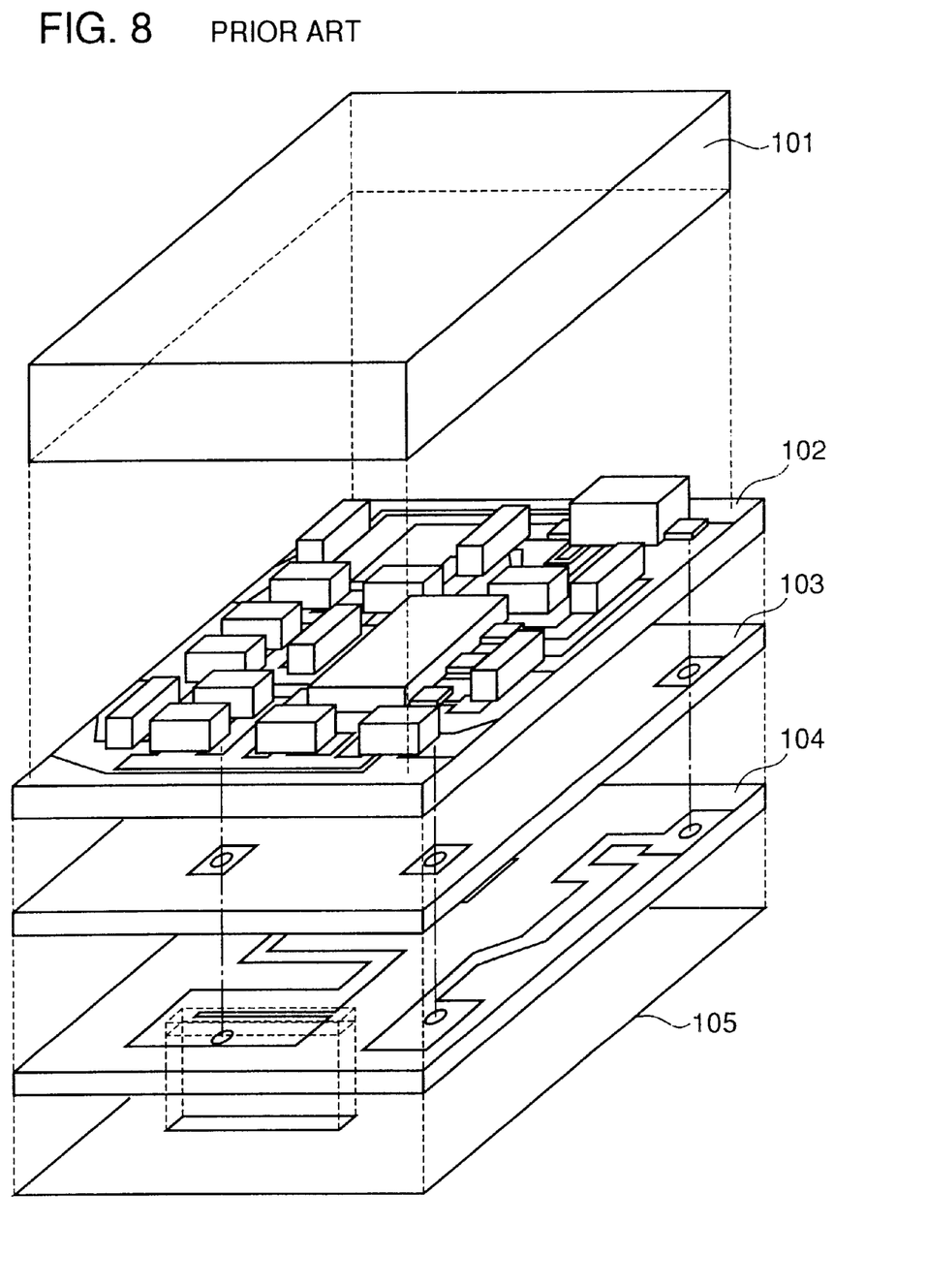
FIG. 8 is a perspective view of a main portion showing a schematic structure of a conventional high frequency module.

One example of a conventional high frequency module is shown in a schematic perspective view of FIG. 8. The conventional high frequency module has a configuration in which, as shown in FIG. 8 from the bottom, an underside shield layer 105, a substrate layer 104 in which a strip line for a resonator is formed, a ground layer 103, a top layer 102 in which a so-called chip component (a resistor, a capacitor, and other semiconductor component) is mounted, and a metal cap shield case 101 are stacked.

Due to such a configuration, the size and the thickness of the conventional high frequency module is determined by the shapes of these components. According to market demand, component manufacturers concentrate their efforts on reducing the size and the thickness of these chip components.

On the other hand, assembly manufacturers proceed with their circuit design effort by introducing special facilities and a variety of simulators in order to effect high density mounting. Under such circumstances, more compact, thinner, and lighter types of a variety of cellular phones, PDA (Personal Digital Assistants) and the like are needed. In order to meet the need, the miniaturization of the module has become indispensable.

For the conventional module, the transition is being made from the chip size of 1608 (1.6 mm×0.8 mm) to the chip size of 1005 (1.0 mm×0.5 mm), and in some cases, even the chip size of 0603 (0.06 mm×0.3 mm) is adopted. The transition from the 1005 size chip to the 0603 size chip would involve an exponentially greater number of problems related to the unit cost of components, mounting, mounting facilities, yield, and so on.

The background art, however, is not fully prepared to achieve the compactness, the lightness in weight, and the low cost as demanded by the market as described above. Moreover, once the process technology for the 0603 size chip is established, the novel miniaturization technology to be applied to the process technology must be considered. The above-described background art would prove insufficient for such application to the process technology.

SUMMARY OF THE INVENTION

The present invention is made to solve the above problem, and its object is to provide a compact, light-weight, low cost high frequency module that facilitates design modification.

To achieve the above object, the high frequency module according to the present invention is provided with a first passive element array layer with interconnection including a plurality of first passive elements formed in an array and a first passive element interconnection pattern for providing electrical connection among the plurality of first passive elements, and a second passive element array layer with interconnection including a plurality of second passive elements formed in an array and a second passive element interconnection pattern for providing electrical connection among the plurality of second passive elements. The configuration of the present invention is characterized in that a desired circuit constant can be obtained by providing interconnections among the plurality of first passive elements or among the plurality of second passive elements in any given combination simply by modifying the first or the second passive element interconnection pattern.

One of a resistor element, a capacitor element, and an inductor element corresponds to the above first passive element. Similarly, one of a resistor element, a capacitor element, and an inductor element corresponds to the above second passive element.

In the high frequency module according to the present invention, the first passive element array layer with interconnection and the second passive element array layer with interconnection, for instance, are formed on different surfaces of the substrate or both on the same surface of the substrate. In either case, the first passive element interconnection pattern and the second passive element interconnection pattern are electrically connected by the interconnection that lies between the first passive element array layer with interconnection and second passive element array layer with interconnection.

When the first passive element array layer with interconnection and the second passive element array layer with interconnection are respectively formed on the top surface and the back surface of one substrate, the electrical connection between the first passive element interconnection pattern and the second passive element interconnection pattern is provided by a conductive layer formed in a through hole provided through the substrate.

According to the present invention, with the above-described configuration, resistor elements, capacitor elements, or inductor elements may be formed in an array of elements having a prescribed resistance value, capacitance value, or inductance value that is predetermined irrespective of the specific use to which the high frequency module is applied, and the circuit constant required for a desired use can be obtained by combining these elements by the modification of the interconnection pattern alone. Such a high module can be applied to a wide variety of uses so that it can be designed as a standard high frequency module that meets a variety of demands. This results in mass production that achieves a significant reduction in the production cost.

In addition, upon design modification, only the modification of the interconnection pattern of each array layer is required besides the modification of the circuit design so that the development time as well as the development cost can be reduced.

The formation of a resistor array, a capacitor array, or an inductor array as a passive element array for the high frequency module according to the present invention using such techniques as printing, evaporation, photo etching, and selective plating improves precision, so that a module having a desired performance characteristic can be formed, which is industrially significant.

Moreover, since a passive element in the form of a chip component is not used, there no longer is the need to handle an extremely small chip component such as the conventional 0603 size chip. Thus, expensive equipments such as a mounter become unnecessary.

Furthermore, according to the present invention, a great number of passive components can be built inside by forming them on a main surface of a substrate layer to be stacked so that only the semiconductor components that are the active components need to be mounted, on the top layer in an upper portion of the stacked body, for instance. This can be sufficiently managed by the conventional facilities.

In one preferred example of the high frequency module according to the present invention, at least one of a strip line and an active electronic component is arranged above or below, or both above and below the first passive element array layer with interconnection.

The high frequency module according to the present invention can be configured such that all of either the plurality of first passive elements or the plurality of second passive elements have the same resistance value, capacitance value, or inductance value. In addition, either the plurality of first passive elements or the plurality of second passive elements may be divided into a plurality of groups, and all the passive elements forming each group may be set with the same resistance value, capacitance value, or inductance value.

The above-described configuration becomes possible since a desired circuit constant can be obtained by providing interconnections among the plurality of first passive elements or among the plurality of second passive elements in any given combination by simply modifying only the first or second passive element interconnection pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

The embodiment of the present invention will be described below in relation to the drawings.

Figure 1A:
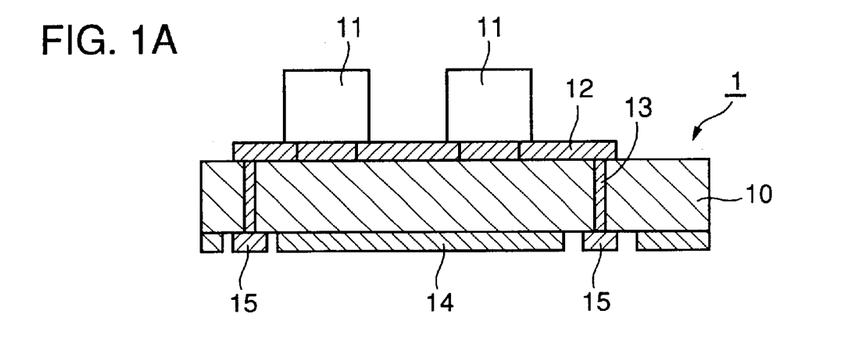
FIGS. 1A–1D is a cross sectional view of a main portion showing a schematic structure of a high frequency module according to an embodiment of the present invention.
Figure 1B:
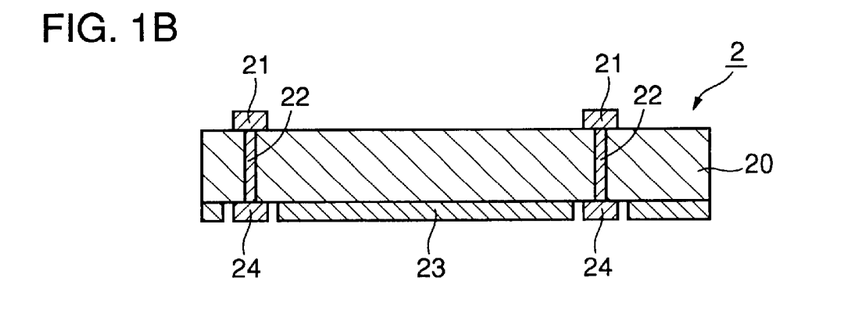
Figure 1C:
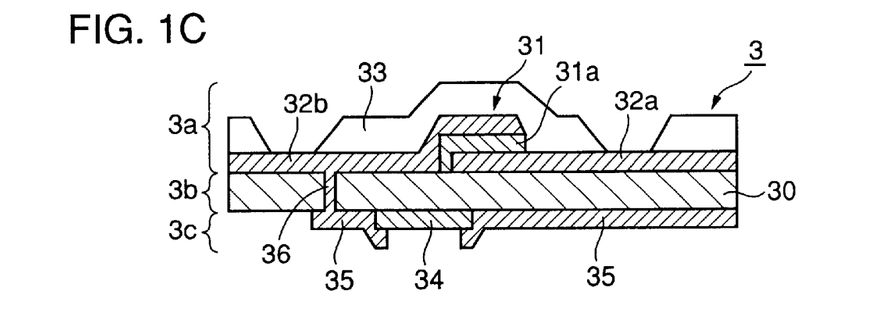
Figure 1D:
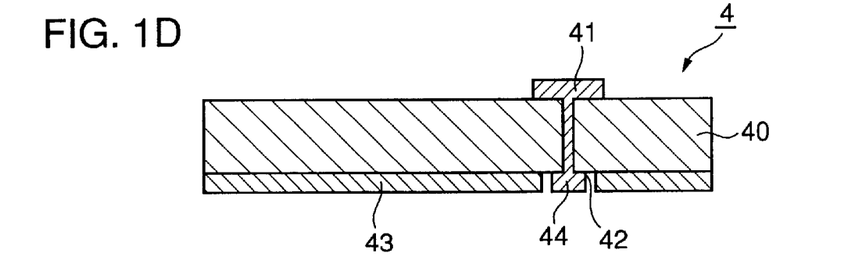

FIGS. 1A to 1D are cross sectional views of the main portion showing the schematic structure of a high frequency module of the present embodiment in which four substrate layers are stacked, where each substrate layer is shown in isolation so as to indicate the boundaries between the substrate layers more clearly. The high frequency module is formed in stacked layers, from the top, of a first substrate layer 1 as a top substrate layer (FIG. 1A), a second substrate layer 2 (FIG. 1B), a third substrate layer 3 (FIG. 1C), and a fourth substrate layer 4 (FIG. 1D). Of these substrate layers, the third substrate layer 3 shown in FIG. 1C characterizes the present embodiment. Therefore, the description of third substrate layer 3 will be provided first.

In third substrate layer 3, a capacitor array layer with interconnection 3a including a capacitor element 31 arranged in an array and interconnection pattern layers 32a and 32b is formed on an upper surface of an insulating substrate 30 of third substrate layer 3. In addition, a resistor array layer with interconnection 3c including a resistor film 34 arranged in an array and an interconnection pattern 35 is formed on an underside of insulating substrate 30. Moreover, a via hole 36 is formed in insulating substrate 30, and resistor array layer with interconnection 3c and capacitor array layer with interconnection 3a are electrically connected via a conductor embedded in via hole 36. Therefore, insulating substrate 30 corresponds to an interconnection layer 3b.

In capacitor array layer with interconnection 3a on the upper surface of insulating substrate 30, interconnection patterns 32a and 32b including an electrode and an interconnection formed by a conductive material such as Al and Cu are formed such that interconnection patterns 32a and 32b sandwich a $TaO_2$ (tantalum oxide) thin film 31a that is to form a dielectric film for a capacitor 31, thereby forming capacitor element 31. An insulating film 33 formed of a resin material or the like is provided on interconnection patterns 32a and 32b except for a portion (contact portion) that is electrically connected to second substrate layer 2 arranged above.

In addition, in resistor array layer with interconnection 3c below insulating substrate 30, an interconnection pattern 35 including an electrode and an interconnection formed by a conductive material such as Al and Cu is formed such that resistor film 34 formed of a resistance material such as W is surrounded from both sides in the horizontal direction of the diagram by interconnection pattern 35.

A portion of interconnection patterns 32a and 32b of capacitor array layer with interconnection 3a and a portion of interconnection pattern 35 of resistor array layer with interconnection 3c are electrically connected by via hole 36 formed within insulating substrate 30 so that insulating substrate 30 functions as interconnection layer 3b.

Although only a single capacitor element and a single resistor element are shown in FIG. 1C, in practice, they are provided in plurality and formed in arrays.

The present embodiment being thus configured, for capacitor array layer with interconnection 3a a capacitance value as a constant required for the circuit can be obtained from a combination of these capacitor elements that is created by selectively providing interconnection lines to capacitor elements according to the desired circuit design by patterning interconnection pattern 32.

Moreover, for resistor array layer with interconnection 3c, a resistance value as a constant required for the circuit can be obtained from a combination of these resistance elements that is created by selectively providing interconnections to the resistance elements according to the desired circuit design by patterning interconnection pattern 35.

Second substrate layer 2 is stacked on third substrate layer 3. Second substrate layer 2 has a ground conduction layer 23 and a connecting terminal 24 for connection with third substrate layer 3 both formed under an insulating substrate 20. Connecting terminal 24 is electrically connected to a portion of interconnection pattern 32 of capacitor array layer with interconnection 3a of third substrate layer 3 in a region where insulating film 33 is not formed.

On insulating substrate 20, a connecting terminal 21 that is electrically connected to connecting terminal 24 via a through hole 22 formed within insulating substrate 20 and that provides electrical connection with first substrate layer 1 is formed.

First substrate layer 1 (top substrate layer) is stacked on second substrate layer 2. First substrate layer 1 has a strip line 14 and a connecting terminal 15 for connection with second substrate layer 2 both formed under an insulating substrate 10. Connecting terminal 15 is electrically connected to connecting terminal 21 of second substrate layer 2.

Active electronic components 11 and an interconnection pattern 12 for active electronic components 11 are formed above insulating substrate 10. A portion of interconnection pattern 12 is electrically connected to connecting terminal 15 via a through hole 13 formed within insulating substrate 10.

Moreover, fourth substrate layer 4 is stacked below the above-described third substrate layer 3. In fourth substrate layer 4, a connecting terminal 41 electrically connected to a portion of interconnection pattern 35 of resistor array layer with interconnection 3c of third substrate layer 3 is formed above an insulating substrate 40.

A ground plane 43 and a connecting terminal 44 electrically connected to connecting terminal 41 via a through hole 42 formed within insulating substrate 40 are formed below insulating substrate 40.

Interconnection patterns, connecting terminals and connecting portions, through holes, via holes, etc. in FIGS. 1A–1D are shown to represent the concept and in no way limit the present invention. Interconnection lines and the like are provided as required.

Now, the high frequency module according to the present embodiment will be described in relation to FIG. 2 which is a schematic representation showing the concept of this high frequency module.

Resistor array 56 is a plurality of resistor elements arranged in an array, and an interconnection pattern for resistors 55 is an interconnection pattern for this resistor array 56. Resistor array 56 and interconnection pattern for resistors 55 correspond to resistor array layer with interconnection 3 of third substrate layer 3 of FIG. 1C. Capacitor array 54 is a plurality of capacitor elements arranged in an array, and interconnection patterns 53a and 53b are interconnection patterns for capacitor array 54. Capacitor array 54 and interconnection patterns for capacitors 53a and 53b correspond to capacitor array layer with interconnection in FIG. 1C. In FIG. 2, for clarity, interconnection patterns 55, 53a, and 53b are shown as layers separate from capacitor array 54 and resistor array 56. An interconnection layer 58 corresponding to interconnection layer 3b shown in FIG. 1C resides between interconnection pattern for capacitor array 53a and interconnection pattern for resistor ray 55.

According to the present embodiment thus configured, for instance, resistor array 56 and capacitor array 54 respectively formed by resistor elements and capacitor elements can be the arrays of elements having a constant resistance value and a constant capacitance value, respectively, and a constant required for the circuit can be obtained from a combination of these elements. A module for specific use normally can be provided by changing the circuit constant so that a variety of needs can be met by simply modifying interconnection patterns 55, 53a, and 53b.

On interconnection pattern for capacitors 53b, a strip line 52 (corresponding to strip line 14 of first substrate 1 in FIG. 1A) is arranged, and thereon an upper surface shield substrate 51 (not shown in FIG. 1A) is provided. An underside shield layer 57 (corresponding to ground plane 43 of the fourth substrate layer 4 in FIG. 1D) is arranged under resistor array 56.

Figure 2:
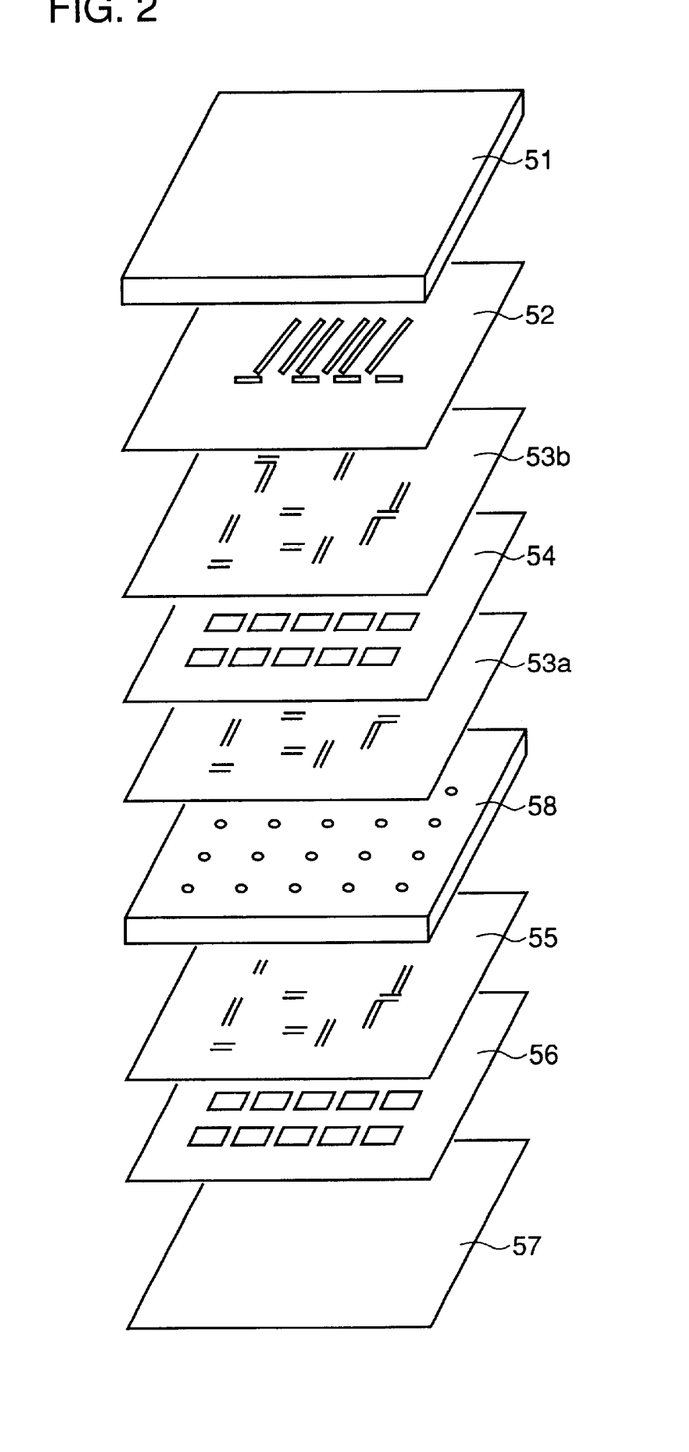
FIG. 2 is a schematic perspective view showing the concept of the high frequency module according to the embodiment of the present invention.

Moreover, in the above-described present embodiment, either the capacitance values of the plurality of capacitor elements forming capacitor array layer with interconnection 3a in FIG. 1C or forming capacitor array 54 in FIG. 2, or the resistance values of the plurality of resistor elements forming resistor array layer with interconnection 3c in FIG. 1C or forming resistor array 56 in FIG. 2 may be all set to the same value. In addition, if required by the design, the plurality of capacitor elements or the plurality of resistor elements forming an array may be divided into some groups, each group being set with a different capacitance value or a different resistance value. Thus, even when the constant of an element (a capacitance value, a resistance value, inductance and the like) is already set, it may be adjusted to the constant required for the designed circuit, basically by simply selecting the interconnection patterns.

In the above present embodiment, capacitor array layer with interconnection 3a and resistor array layer with interconnection 3c are formed on either side of one insulating substrate 30 as in third substrate layer 3 of FIG. 1C. According to the desired circuit scale, however, these arrays can be formed on one side of the substrate. In this case, a resistor array, a capacitor array, and their interconnection patterns should be formed within the same surface, and then, interconnections should be provided. This is effective when the circuit scale does not require such a high degree of integration of the resistor array and the capacitor array, and here, the number of stacked layers can be reduced.

Further, although the description of the present embodiment is given above with respect to the selectivity provided by the interconnection pattern of capacitor elements or the resistor elements, the approach of selectively providing interconnections to inductors formed by strip line 14 of first substrate layer 1 in FIG. 1A or by strip line 52 in FIG. 2 as a circuit element is also conceivable as a matter of course.

Furthermore, as a method of forming the capacitor array or the resistor array of the present embodiment, the lithography technique, the vacuum evaporation technique, and a technique such as one of forming a thicker interconnection layer by plating that are frequently utilized in the IC (Integrated Circuit) field as well as the printing technique employed in the hybrid IC technology are utilized.

In comparison with the conventional high frequency module shown in FIG. 8 that involves mounting of chip components, the high frequency module of the present embodiment can be made extremely thin such that the chip height is in the order of the film thickness.

In addition, since the precision of the interconnections at masking level and the dimensional precision of a capacitor or a resistor are improved, a characteristic closer to the design value can be achieved, while at the same time, a more compact module can be produced. Moreover, the high frequency module according to the present embodiment can be formed using a process employed for an IC so that it is fit for mass production and can easily accommodate modification with minor changes such as the change of interconnection masks.

As seen from the above, according to the present invention, the high frequency module of a thinner and more compact type can be produced, and the reduction in facilities and even in the development time can be easily achieved.

Now, two examples of third substrate layer 3 of the present embodiment, one example involving the versatile structure that can be produced in advance and stored for later use and another example involving the structure after having modified the interconnection pattern to form the desired specific circuit, will be described below based on FIGS. 3A to 7B.

EXAMPLE 1

First, as example 1, the structure in which, in application of the concept of the present invention, a capacitor array 31 and interconnection patterns for capacitors 32a and 32b are formed on insulating substrate 30 while a resistor array 34 and an interconnection pattern for resistors 35 are formed under insulating substrate 30 will be described in relation to FIGS. 3A to 5.

Figure 3A:
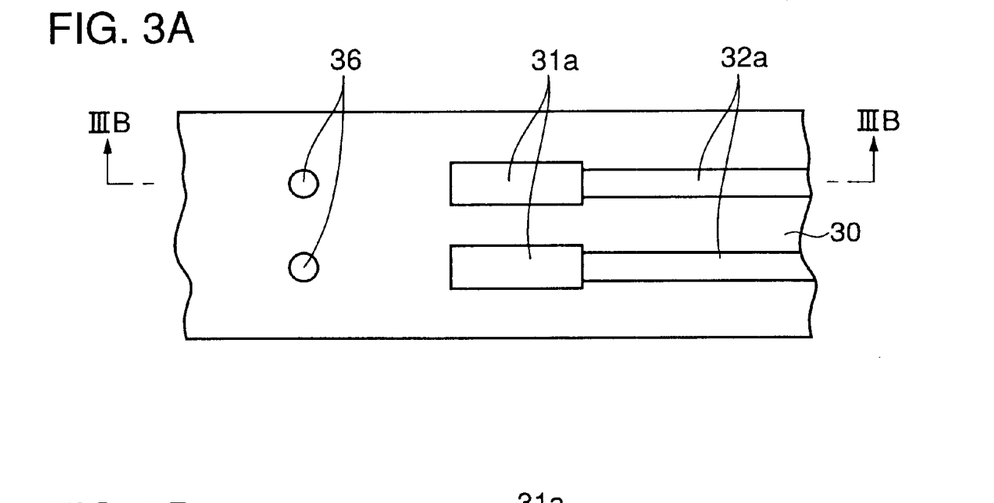
FIGS. 3A to 3C are diagrams showing a structure produced in advance and stored for later use in a stage prior to forming the specific circuit of Example 1, with FIG. 3A showing a plan view, FIG. 3B showing a cross sectional view taken along the line IIIB—IIIB of FIG. 3A, and FIG. 3C showing a bottom plan view, respectively.
Figure 3B:
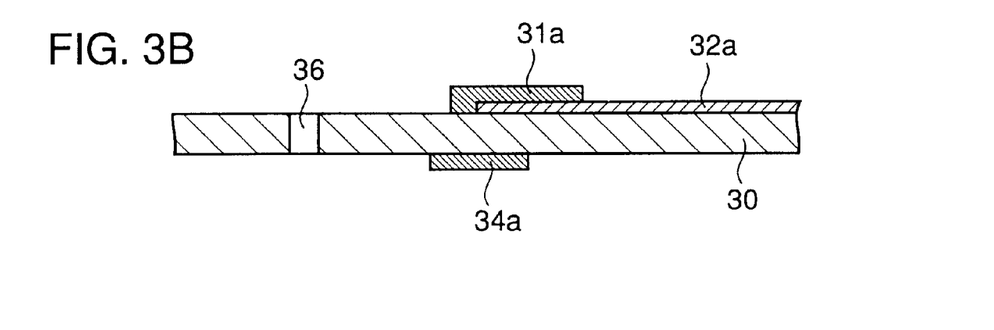
Figure 3C:
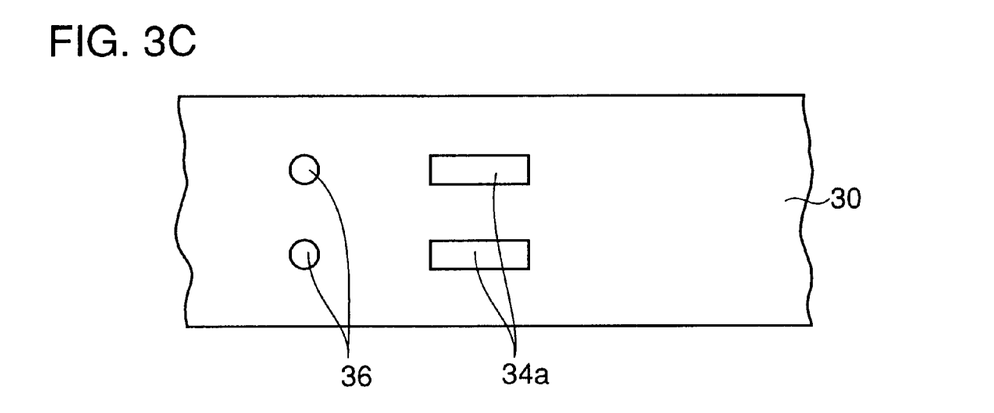

FIGS. 3A to 3C illustrate the structure that can be produced in advance and stored for later use in a stage prior to forming a specific circuit of the present example. In this state, a $TaO_2$ thin film 31a that is to form a dielectric film of capacitor array 31 and, of the two interconnection patterns 32a and 32b formed sandwiching $TaO_2$ thin film 31a in the vertical direction of the diagram, only interconnection pattern 32a that is closer to the lower layer is formed on insulating substrate 30. In addition, only a resistor film 34a forming resistor array 34 is formed on the underside of insulating substrate 30.

Figure 4A:
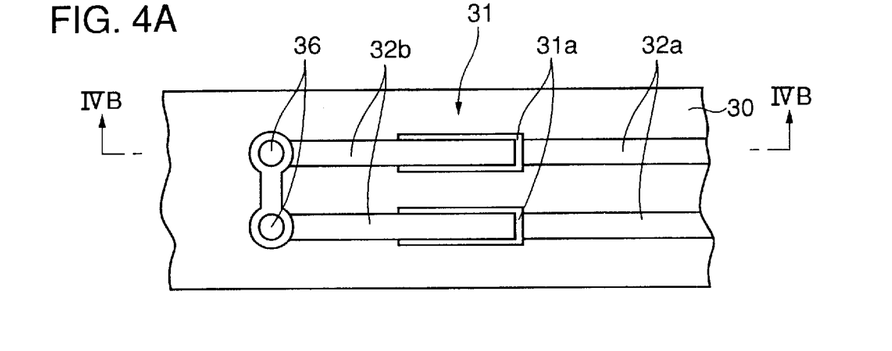
FIGS. 4A to 4C are diagrams representing the structure after forming the specific circuit of Example 1, with FIG. 4A showing a plan view, FIG. 4B showing a cross sectional view taken along the line IVB—IVB of FIG. 4A, and FIG. 4C showing a bottom plan view, respectively.
Figure 4B:
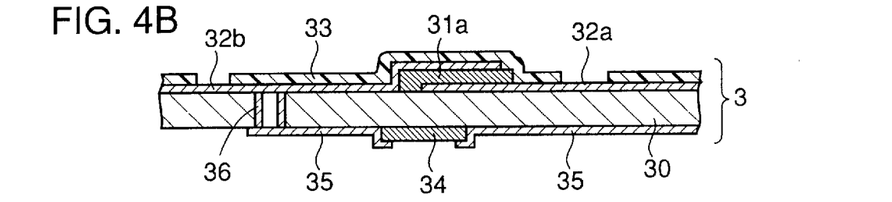
Figure 4C:
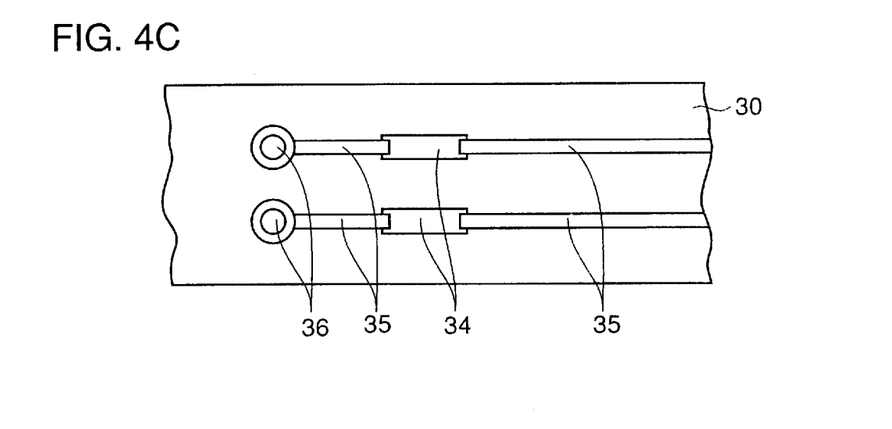
Figure 5:
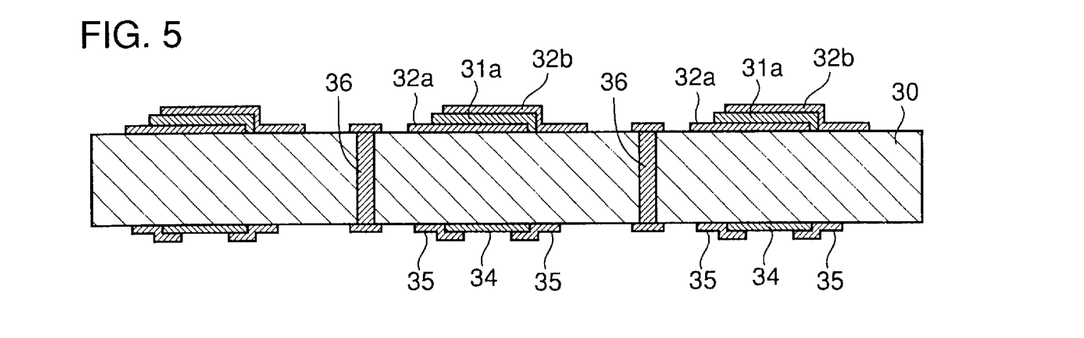
FIG. 5 is a cross sectional view showing the structure in which the circuit of example 1 shown in FIGS. 4A to 4C are arranged in three rows in the lateral direction.

Upon the structure thus prepared in advance, an interconnection pattern 32b corresponding to the desired circuit is formed (see FIGS. 4A and 4B) on an upper surface of insulating substrate 30 from the top surface of $TaO_2$ thin film 31a across to via hole 36, and an interconnection pattern 35 corresponding to the desired circuit is formed on the underside of insulating substrate 30 such that interconnection pattern 35 surrounds resistor film 34a from both sides in the horizontal direction, whereby the structure shown in FIGS. 4A to 4C is obtained.

The structure shown in FIGS. 4A to 4C is only a part of the circuit that is formed. In practice, a circuit is formed in which a plurality of such structures are formed lengthwise and crosswise when seen from above and which has a cross sectional structure as the one shown in FIG. 5, for instance.

EXAMPLE 2

Now, as example 2, the structure in which, in application of the concept of the present invention, capacitor array 31 and interconnection patterns for capacitors 32a and 32b, and resistor array 34 and interconnection pattern for resistors 35 are both formed on an upper surface of insulating substrate 30 will be described in relation to FIGS. 6A to 7B.

Figure 6A:
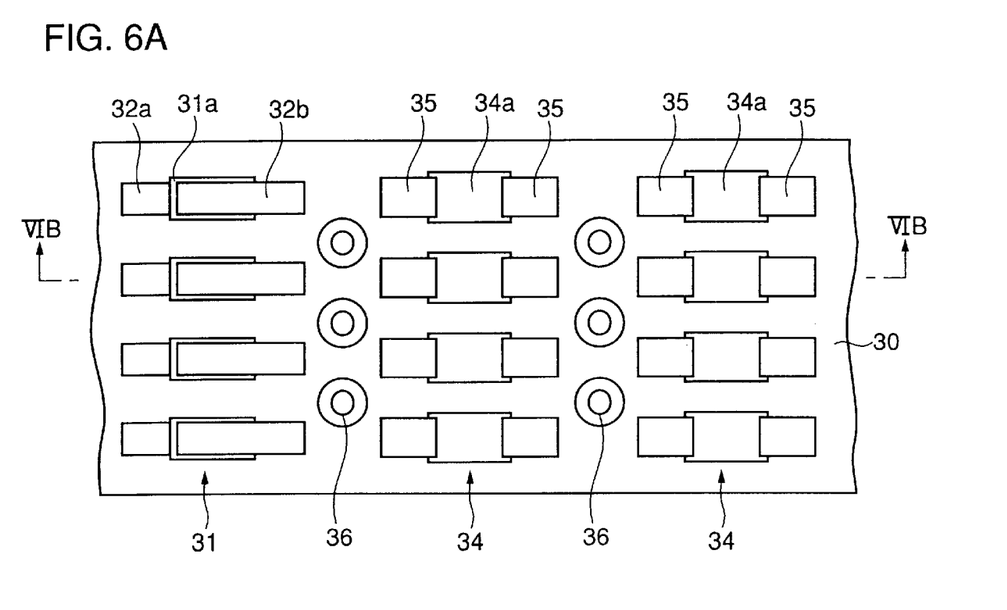
FIGS. 6A and 6B are diagrams showing a structure produced in advance and stored for later use in a stage prior to forming a specific circuit of Example 2.
Figure 6B:
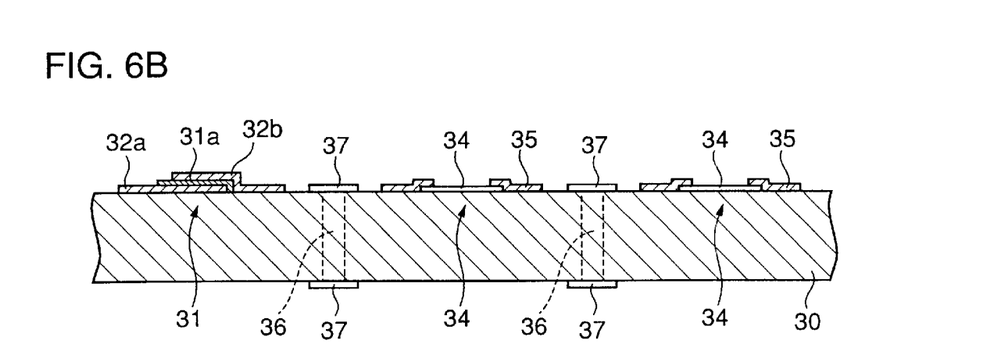

FIGS. 6A and 6B represent the structure that can be produced in advance and stored for later use in a stage prior to forming the specific circuit of the present example. In this state, $TaO_2$ thin film 31a that is to form a dielectric film of capacitor array 31 is formed on an upper surface of insulating substrate 30, and interconnection patterns 32a and 32b are formed over and only in the vicinity of $TaO_2$ thin film 31a such that they sandwich $TaO_2$ thin film 31a in the vertical direction of the diagram. Moreover, in the present example, resistor film 34a forming resistor array 34 and interconnection pattern 35, which is formed only in the vicinity of each resistor film 34a such that interconnection pattern 35 surrounds resistor film 34a from both sides in the horizontal direction, are formed on the upper surface of the insulating substrate. In addition, a conductive film 37 is formed on the inner peripheral surface of a via hole provided through insulating substrate 30 and on both the upper surface and the underside of the insulating substrate in the vicinity of the via hole.

Figure 7A:
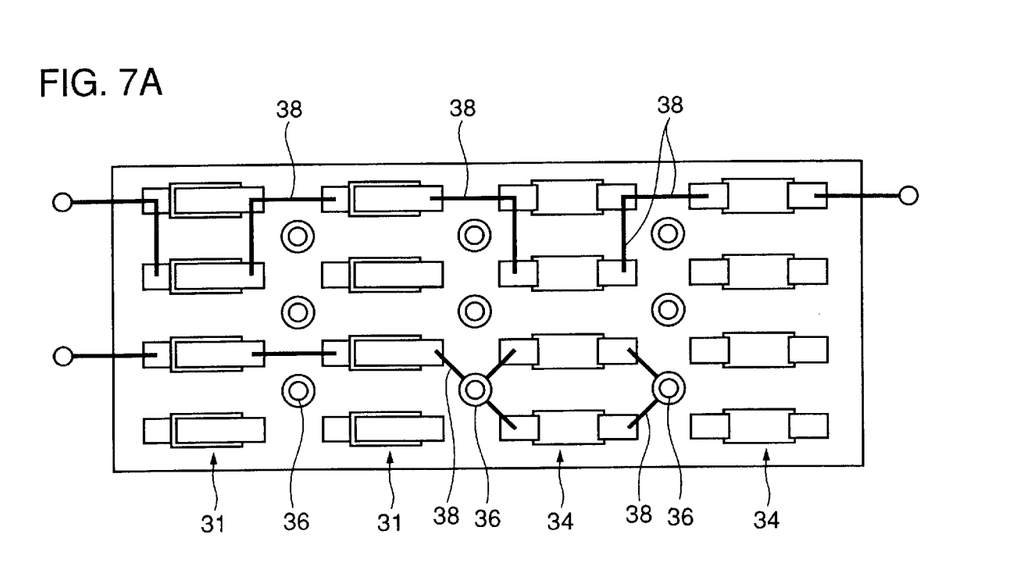
FIG. 7A is a layout plan view showing the structure after forming the specific circuit of example 2.
Figure 7B:
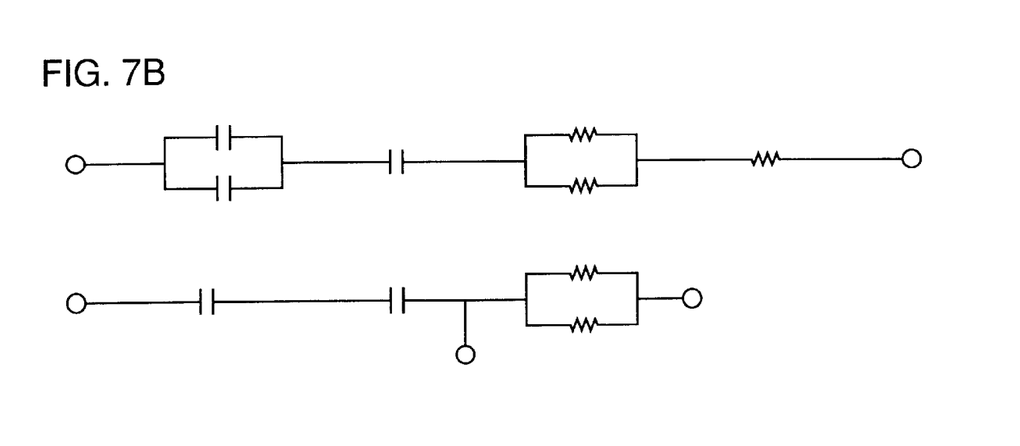
FIG. 7B is an equivalent circuit diagram of the same.

To the structure thus prepared in advance, an interconnection pattern 38 corresponding to the desired circuit is additionally provided on an upper surface of insulating substrate 30 such that particular ones of interconnection patterns 32a, 32b, 35, and 37 are electrically connected, whereby the structure shown in FIGS. 7A and 7B is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high frequency module, comprising:
   a first passive element array layer including a plurality of first passive elements formed in an array and a first passive element interconnection pattern for providing electrical connection among said plurality of first passive elements;
   a second passive element array layer including a plurality of second passive elements formed in an array and a second passive element interconnection pattern for providing electrical connection among said plurality of second passive elements; and
   additional passive element interconnection pattern for providing a desired circuit constant between said first and second passive element array layers, the additional passive element interconnection pattern modifying only said first and second passive element interconnection patterns by creating additional interconnection patterns whereby some first and second passive elements may be left idle.

2. The high frequency module according to claim 1, wherein each of said plurality of first or second passive elements is one of a resistor element, a capacitor element, and an inductor element.

3. The high frequency module according to claim 1, wherein said first passive element array layer and said second passive element array layer are formed on different surfaces, and an interconnection electrically connecting the two array layers resides between said first and second passive element array layers.

4. The high frequency module according to claim 3, wherein said first passive element array and said second passive element array layer are formed on a top surface and a back surface of a substrate, said first passive element interconnection pattern and said second passive element interconnection pattern being electrically connected by a conductive layer formed in a through hole provided through said substrate.

5. The high frequency module according to claim 1, wherein said first and second passive element array layers are formed on a same surface, and an interconnection electrically connecting said first and second passive element interconnection patterns lies between said first and said second passive element array layers, so as to connect said first and said second passive element array layers.

6. The high frequency module according to claim 2, wherein at least one of a strip line and an active electronic component is arranged either above or below said first passive element array layer.

7. The high frequency module according to claim 2, wherein all of at least one of said plurality of first and second passive elements have a same resistance value, a same capacitance value, or a same inductance value.

8. The high frequency module according to claim 2, wherein at least one of said plurality of first and second passive element is divided into a plurality of groups, and each of the passive elements forming each of said plurality of groups have a same resistance value, a same capacitance value, or a same inductance value.

9. A structure for use in forming a high frequency module comprising:
   a substrate;
   a first array layer having a plurality of first elements arranged on one side of the substrate, each of said first elements having a pair of interconnection pattern portions connected thereto;
   a second array layer having a plurality of second elements arranged on the other side of the, substrate, each of said second elements having a pair of interconnection pattern portions connected thereto,
   wherein only one of the pair of interconnection pattern portions of the first array layer is connected to only one of the pair of interconnection pattern portions of the second array layer through the substrate therebetween; and
   a first and a second additional interconnection pattern arranged on each side of the substrate, respectively, for providing a desired circuit constant between said first and second array layers, the first and second additional interconnection patterns configured so as to only modify one or more of the interconnection pattern portions by creating additional interconnection portions, whereby some. first and second elements may be left idle.

10. The structure of claim 9, wherein a portion of the structure, including parts of the first and second array layers and a part of their interconnection patterns, is formed in advance as a sub-structure, to be stored for later incorporation into the structure used to form the high frequency module.

11. The structure of claim 9, wherein each of said first elements are in contact with each corresponding pair of interconnection pattern portions, with one of the pair of interconnection pattern portions arranged atop its corresponding first element, the other interconnection pattern portion provided between its corresponding first element and the substrate, as viewed in a cross-sectional plane of the structure.

12. The structure of claim 9, wherein each of said second elements are in contact with each corresponding pair of interconnection pattern portions, with said second element being interposed between each pair of interconnection pattern portions so that the interconnection pattern portions are separated from one another, as viewed in a cross-sectional plane of the structure.

13. The structure of claim 10, wherein the pre-formed sub-structure includes the substrate, a first element and one interconnection pattern portion of the first element's corresponding pair of interconnection pattern portions, a second element, and wherein the substrate is provided with a via hole therethrough to connect one interconnection portion of the first array layer with one interconnection portion of the second array layer.

14. The structure of claim 9, wherein the plurality of first and second elements are selected from the group consisting of at least capacitors, resistors and inductors.

15. The structure of claim 9, wherein the additional interconnection patterns includes interconnection lines that are selectively provided to particular first or second elements as desired or required.

16. The structure of claim 15, wherein a high frequency module for a specific use is obtained solely by the addition of the additional interconnection pattern.

17. The structure of claim 15, wherein a thickness of the formed high frequency module, and hence chip height, is minimized due to the arrangement of the interconnection portions, the additional interconnection pattern and arrays of first and second elements on the substrate.

18. A structure for use in forming a high frequency module comprising:
   a substrate;
   a first array layer having a plurality of first elements, each of said first elements having a pair of interconnection pattern portions that are arranged so that one of the interconnection portions overlaps its corresponding first element and the other is between the first element and the substrate; and
   a second array layer having a plurality of second elements, each of said second elements having a pair of interconnection pattern portions connected thereto, with each interconnection portion overlapping ends of its corresponding second element but separate from the other interconnection portion of the pair,
   wherein said first and second array layers are arranged in side-by-side relation on the same side of the substrate, but separated from one another along a horizontal plane on the substrate by a conductive film that is formed on a surface of a via hole in the substrate between adjacent first and second array layers; and
   an additional interconnection pattern for providing a desired circuit constant between said first and second array layers, the additional interconnection pattern configures so as to modifying only one or more of the interconnection patterns by creating additional interconnection portions.

19. The structure of claim 18, further including a plurality of first array layers and second array layers, wherein pairs of first and second array layers, pairs of first arrays layers, or pairs of second. array layers are arranged in side-by-side relation but arrays in each pair are separated from each other by the conductive film formed on the via hole provided through the substrate, wherein part of the structure is formed in advance with desired interconnection patterns so as to be used for a specific or desired circuit structure.

20. The structure of claim 19, wherein the pre-formed structure is provided with the additional interconnection pattern connecting the various first and second array layers in order to arrive at a desired circuit.

21. The structure of claim 18, wherein the plurality of first and second elements are selected from the group comprising at least capacitors, resistors and inductors.

22. The structure of claim 18, wherein the additional interconnection pattern includes interconnection lines selectively provided to particular first or second elements as desired or required, by patterning the desired interconnection lines during manufacture of the structure.

23. A method for forming a high frequency module, comprising:

providing a first passive element array layer including a plurality of first passive elements formed in an array;

providing an electrical connection among said plurality of first passive elements by incorporating a first passive element interconnection pattern;

providing a second passive element array layer including a plurality of second passive elements formed in an array; and providing electrical connection among said plurality of second passive elements by incorporating a second passive element interconnection pattern, wherein modifying only said first and second passive element interconnection patterns between said first and second passive element array layers in the high frequency module, by modifying any of the first or second passive element array layers and thereby obtaining a desired constant.

24. A method for forming a high frequency module comprising:

providing a substrate;

providing a first array layer having a plurality of first elements arranged on one side of the substrate;

connecting a pair of interconnection pattern portions to each of said first elements;

providing a second array layer having a plurality of second elements arranged on the other side of the substrate;

connecting a pair of interconnection pattern portions to each of said second elements;

wherein only one of the pair of interconnection pattern portions of the first array layer is connected to only one of the pair of interconnection pattern portions of the second array layer through the substrate therebetween; and configuring the structure so as to obtain a desired circuit constant by only modifying one or more of the interconnection patterns, and not any of the first or second elements or any other structure used in forming the high frequency module.

25. A method for forming a high frequency module comprising:

providing a substrate;

providing a first array layer having a plurality of first elements;

providing a pair of interconnection pattern portions to each of said first elements that are arranged so that one of the interconnection portions overlaps its corresponding first element and the other is between the first element and the substrate;

providing a second array layer having a plurality of second elements;

connecting a pair of interconnection pattern portions to each of said second elements, with each interconnection portion overlapping ends of its corresponding second element but separate from the other interconnection portion of the pair;

arranging said first and second array layers in a side-by-side relation on the same side of the substrate, but separated from one another along a horizontal plane on the substrate by a conductive film that is formed on a surface of a via hole in the substrate between adjacent first and second array layers; and configuring the structure so as to obtain a desired circuit constant by modifying only one or more of the interconnection patterns, and not any of the first or second elements or any other structure used in forming the high frequency module.

* * * * *